US012761550B2

(12) United States Patent
Ando

(10) Patent No.: US 12,761,550 B2
(45) Date of Patent: Oct. 13, 2026

(54) MOLDING APPARATUS, MOLDING METHOD, AND METHOD FOR MANUFACTURING A PRODUCT

(71) Applicant: CANON KABUSHIKI KAISHA, Tokyo (JP)

(72) Inventor: Toshiaki Ando, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 58 days.

(21) Appl. No.: 18/792,325

(22) Filed: Aug. 1, 2024

(65) Prior Publication Data

US 2024/0393681 A1 Nov. 28, 2024

Related U.S. Application Data

(62) Division of application No. 17/821,017, filed on Aug. 19, 2022, now Pat. No. 12,078,926.

(30) Foreign Application Priority Data

Aug. 30, 2021 (JP) ................................ 2021-140206

(51) Int. Cl.
*G03F 7/00* (2006.01)

(52) U.S. Cl.
CPC ................................ *G03F 7/0002* (2013.01)

(58) Field of Classification Search
CPC ................................ G03F 7/0002
See application file for complete search history.

(56) References Cited

U.S. PATENT DOCUMENTS

2004/0256764 A1* 12/2004 Choi ...................... B82Y 40/00 264/293
2008/0145773 A1* 6/2008 Wang .................... B29C 43/021 430/22
2010/0109195 A1 5/2010 Xu (Continued)

FOREIGN PATENT DOCUMENTS

EP 3251760 A1 * 12/2017 ......... G03F 7/70758
KR 20040069774 A 8/2004
KR 20060024420 A 3/2006

(Continued)

*Primary Examiner* — Susan D Leong
*Assistant Examiner* — Vipul Malik
(74) *Attorney, Agent, or Firm* — Canon U.S.A., Inc. IP Division

(57) ABSTRACT

A molding apparatus configured to mold a cured object by bringing a mold into contact with a curable composition on a processing target substrate and curing the curable composition with the mold in contact therewith includes a priming unit configured to perform processing for applying a mold release agent onto a surface of the mold that contacts the curable composition, the priming unit being configured to apply the mold release agent onto the mold by placing a curable composition containing the mold release agent on a priming substrate, curing the curable composition while the curable composition and the mold in contact with each other, and separating the mold and the cured curable composition. The molding apparatus further includes a recovery unit configured to perform a recovery processing to recover a state of a surface of the priming substrate on which the curable composition is placed.

3 Claims, 9 Drawing Sheets

(56) References Cited

U.S. PATENT DOCUMENTS

| | | | | |
|---|---|---|---|---|
| 2013/0075361 | A1* | 3/2013 | Kawamonzen ........ | B82Y 40/00 216/41 |
| 2020/0176275 | A1* | 6/2020 | Yonekawa ........ | H01L 21/67011 |

FOREIGN PATENT DOCUMENTS

| | | | |
|---|---|---|---|
| KR | 20110077278 | A | 7/2011 |
| KR | 20110089337 | A | 8/2011 |
| KR | 20200067092 | A | 6/2020 |

* cited by examiner

MOLDING APPARATUS, MOLDING METHOD, AND METHOD FOR MANUFACTURING A PRODUCT

This application is a Divisional of U.S. application Ser. No. 17/821,017, filed Aug. 19, 2022, which claims priority from Japanese Patent Application No. 2021-140206, filed Aug. 30, 2021, all of which are hereby incorporated by reference herein in their entireties.

BACKGROUND

Field

The present disclosure relates to a molding apparatus that molds object to cure on a processing target substrate, and, in particular, to an imprinting apparatus that transfers a pattern of a mold onto a substrate.

Description of the Related Art

With the developing demand for the miniaturization of semiconductor devices, micro electro mechanical systems (MEMSs), and other devices, attention has been attracted to a microfabrication technique of molding a curable composition (a composition that can be cured) on a substrate using a mold (a template) to form a cured object on this substrate, in addition to the conventional lithography technique. This technique is also called an imprinting technique, and can mold an extremely small structure on the order of nanometers on the substrate.

One type of the imprinting technique is a photo-imprinting method utilizing photo-curing. The photo-imprinting method is performed in the following manner. An uncured photo-curable composition is applied onto a substrate, and a light-transmissive mold having a relief structure (a transfer structure such as a circuit pattern) on the order of nanometers is pressed (imprinted) into contact with the photo-curable composition on the substrate. The photo-curable composition is cured with the mold pressed thereon, and the mold is released from the substrate after that, by which the cured object is transferred onto the substrate in a same-sized pattern.

However, in the imprinting method, some cured object may remain on the mold when the mold is released. This is caused by strong adhesive force between the mold and the cured object. Thus, a transfer layer, which otherwise should be transferred to the substrate side, remains on the mold, and this results in a failure to normally complete the transfer on the substrate, creating a defect.

One measure for this issue is a method that forms a layer between the cured object and the mold for reducing the adhesive force to each other, as disclosed in, for example, Japanese Unexamined Patent Application Publication (Translation of PCT Application) No. 2006-528088. This layer is formed by fluorine-containing surfactant molecules called a mold release agent, and can reduce the adhesive force between the mold and the photo-curable composition.

Japanese Patent No. 06628129 discusses a technique including a priming imprinting process of preparing a substrate different from a transfer target substrate, applying an imprinting material containing a mold release agent, and carrying out imprinting, before manufacturing a replica mold from a master mold by the imprinting method.

However, Japanese Patent No. 06628129 does not take the contamination of the substrate surface used in the priming processing into consideration. If the surface of the substrate in use is contaminated in the priming processing performed as a process preceding to the imprinting, a contaminating material may be undesirably attached to the surface of the mold or the cured object may be unintentionally partially attached to the mold due to a reduction in the adhesion between the substrate and the cured object. In other words, the priming processing may be unable to provide a sufficient finish or the inside of the molding apparatus may be undesirably contaminated.

SUMMARY

The present disclosure is directed to providing a molding apparatus advantageous in improving productivity with reliable priming processing as an exemplary object thereof.

According to an aspect of the present disclosure, a molding apparatus configured to mold a cured object by bringing a mold into contact with a curable composition on a processing target substrate and curing the curable composition with the mold in contact therewith includes a priming unit configured to perform processing for applying a mold release agent onto a surface of the mold that contacts the curable composition, the priming unit being configured to apply the mold release agent onto the mold by placing a curable composition containing the mold release agent on a priming substrate, curing the curable composition while the curable composition and the mold in contact with each other, and separating the mold and the cured curable composition. The molding apparatus further includes a recovery unit configured to perform a recovery processing to recover a state of a surface of the priming substrate on which the curable composition is placed.

Further features of the present disclosure will become apparent from the following description of exemplary embodiments with reference to the attached drawings.

DESCRIPTION OF THE EMBODIMENTS

Figure 1:
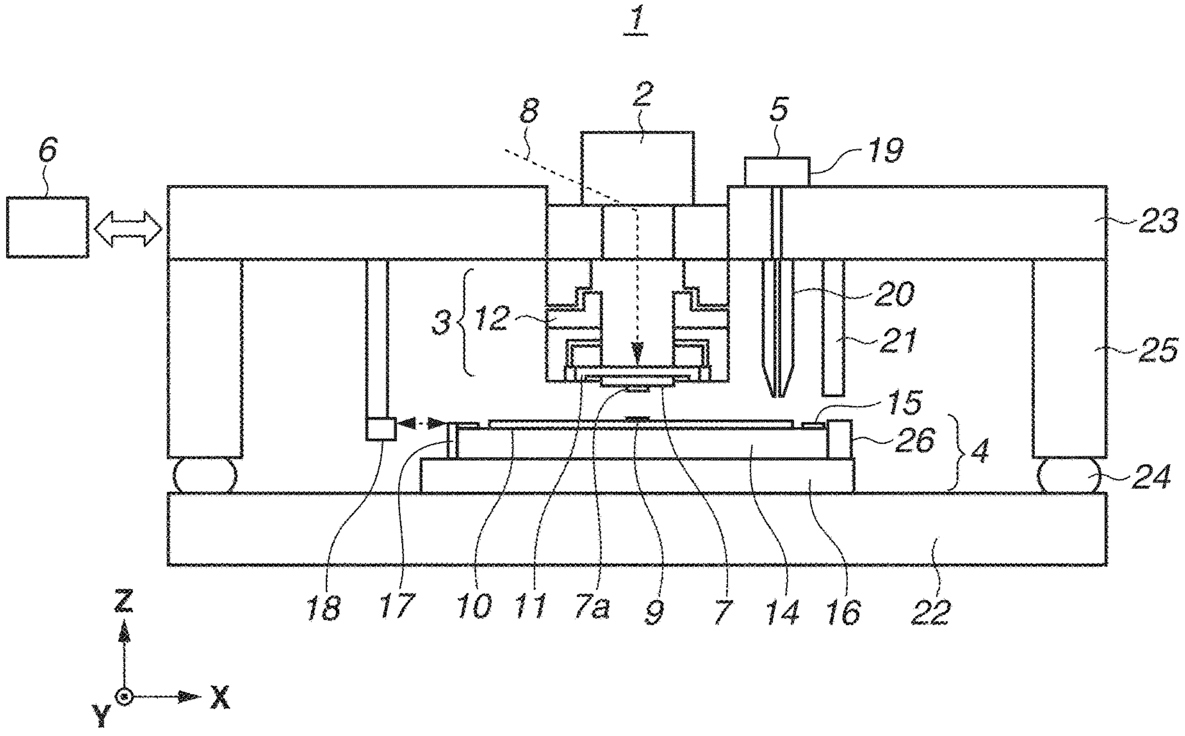
FIG. 1 illustrates the schematic configuration of an imprinting apparatus according to a first exemplary embodiment.

In the following description, some exemplary embodiments of the present disclosure will be described in detail with reference to the accompanying drawings. Like numbers will refer to like members in the drawings, and redundant descriptions will be omitted.

First, FIG. 1 illustrates an imprinting apparatus, which is a molding apparatus according to a first exemplary embodiment of the present disclosure.

The imprinting apparatus according to the present exemplary embodiment brings a photo-curable composition 9 (a curable composition) supplied on a substrate 10 and a light-transmissive mold 7 (a master or a transparent mold) into contact with each other as illustrated in FIG. 1. Then, the imprinting apparatus applies energy for curing to the photo-curable composition 9, thereby forming a cured object with a relief pattern 7*a* of the mold 7 transferred on it.

This imprinting apparatus 1 is an apparatus that is used to manufacture devices such as semiconductor devices, and molds uncured resin on a processing target substrate with the mold 7 to form a resin pattern on the substrate 10. The imprinting apparatus is an imprinting apparatus employing the photo-curing method in the present example.

The photo-curable composition 9 contains at least a polymerizable compound and a photopolymerization initiator, and may contain a non-polymerizable compound or a solvent as appropriate. The non-polymerizable compound is at least one kind of substance selected from a group such as a sensitizer, a hydrogen donator, an internal mold release agent, a surfactant agent, an anti-oxidant, and a polymer component.

The photo-curable composition 9 may be applied onto the substrate 10 in the form of droplets or in the form of an island or a film formed from a plurality of droplets connected to one another by a discharge unit 20, which is a liquid injection head. The viscosity of the photo-curable composition 9 (the viscosity at 25° C.) is, for example, 1 mPa·s or higher and 100 mPa·s or lower.

The present exemplary embodiment will be described assuming that the imprinting apparatus 1 employs a photo-curable method that cures the photo-curable composition 9 by irradiating it with light. Further, in the following description, a Z-axis direction is set to the direction in parallel with the optical axis of an irradiation optical system that irradiates the photo-curable composition 9 on the substrate 10 with light 8, which will be described below, and an X-axis direction and a Y-axis direction are set to two directions orthogonal to each other in a plane perpendicular to the Z-axis direction.

Each unit of the imprinting apparatus 1 will be described with reference to FIG. 1. A mold holding unit 3, which holds the light-transmissive mold 7, includes a mold chuck 11, which holds the mold 7 by attracting it by vacuum attraction force or electrostatic force, and a mold movement mechanism 12, which holds the mold chuck 11 and moves the mold 7 (and the mold chuck 11). The mold chuck 11 and the mold movement mechanism 12 have openings at their central portions (the inner sides) through which the photo-curable composition 9 on the substrate 10 is irradiated with the light 8 from an irradiation unit 2.

The mold movement mechanism 12 moves the mold 7 in the Z-axis direction to selectively press (imprint) the mold 7 against the photo-curable composition 9 on the substrate 10 or separate (release) the mold 7 from the photo-curable composition 9 on the substrate 10. Examples of an actuator employable in the mold movement mechanism 12 include a linear motor and an air cylinder. The mold movement mechanism 12 may include a plurality of driving systems such as a coarse motion driving system and a fine motion driving system to position the mold 7 with high accuracy.

Further, the mold movement mechanism 12 may be configured to move the mold 7 in the Z-axis direction and in the X-axis direction and/or the Y-axis direction. Further, the mold movement mechanism 12 may be configured to have a tilt function for adjusting the position of the mold 7 in a θ direction (a rotational direction around the Z axis) and the tilt of the mold 7.

The mold 7 includes a pattern portion 7*a* in a rectangular outer peripheral shape with a three-dimensionally formed pattern (a relief pattern to be transferred onto the substrate 10, such as a circuit pattern) on its surface facing the substrate 10 (a pattern surface). Desirably, the mold 7 is made from a material that permits light transmission through itself, such as silica. Further, the mold 7 may include a cavity in a circular planar shape with some depth in its surface irradiated with the light 8.

The irradiation unit 2 includes a light source (not illustrated) and the irradiation optical system (not illustrated), and the irradiation optical system includes a combination of optical elements that will be described below. The irradiation unit 2 irradiates the photo-curable composition 9 on the substrate 10 with the light 8 (for example, an ultraviolet ray) via the mold 7 in the imprinting processing (molding processing). The irradiation unit 2 includes the light source, and the optical elements (a lens, a mirror, a light shield plate, and the like) for adjusting light emitted from the light source into a state of the light 8 appropriate for the imprinting processing (a light intensity distribution, an illumination range, and the like). In the present exemplary embodiment, since the photo-curable method is employed, the imprinting apparatus 1 includes the irradiation unit 2.

A substrate chuck 14 holds the substrate 10 by attracting it by vacuum attraction force or electrostatic force.

An assist member 15 is disposed around the substrate chuck 14 and surrounds the substrate 10 held on the substrate chuck 14. Further, the assist member 15 is arranged in such a manner that the upper surface of the assist member 15 and the upper surface of the substrate 10 held on the substrate chuck 14 are located at approximately the same height as each other. The substrate chuck 14 is mounted on a stage driving mechanism 16. Then, the substrate chuck 14 and the stage driving mechanism 16 will be collectively referred to as a substrate stage 4 (a movement unit).

The substrate stage 4 is movable in the X-Y plane. The imprinting apparatus 1 adjusts the positon of the substrate stage 4 in pressing the pattern portion 7*a* of the mold 7 against the photo-curable composition 9 on the substrate 10 to align the position of the mold 7 and the position of the substrate 10 with each other. Examples of an actuator employable in the substrate stage 4 include a linear motor and an air cylinder. Further, the substrate stage 4 may be configured to move the substrate 10 in the X-axis direction and the Y-axis direction and in the Z-axis direction. The mold 7 in the imprinting apparatus 1 is moved the mold 7 in the Z-axis direction for the imprinting and the release. However, the mold 7 may be imprinted or released by the substrate 10 being moved in the Z-axis direction. Alternatively, the mold 7 may be imprinted and released by both the mold 7 and the substrate 10 being relatively moved in the Z-axis direction. Further, the substrate stage 4 may have a tilt function for adjusting the position of the substrate 10 in the 0 direction (the rotational direction around the Z axis) and the tilt of the substrate 10.

Further, the substrate stage 4 includes a plurality of reference mirrors 17 corresponding to the respective directions of X, Y, Z, ωx, ωy, and ωz on its side surface. On the other hand, the imprinting apparatus 1 includes a plurality of laser interferometers 18 that measures the position of the substrate stage 4 by irradiating these reference mirrors 17 with beams such as helium-neon, respectively. FIG. 1 illustrates a single pair of reference mirror 17 and laser interferometer 18. The laser interferometers 18 measure the position of the substrate stage 4 in real time, and a control unit 6, which will be described below, performs control for positioning the substrate 10 (the substrate stage 4) based on the measured values at this time. Alternatively, an encoder may be used to measure the position of the substrate stage 4.

The assist member 15 has a function of preventing first gas (not illustrated), which will be described below, from entering an optical path between the reference mirrors 17 and the laser interferometers 18. Further, the assist member 15 also brings about an effect of keeping gas supplied from a first gas supply unit (not illustrated) at a high density when a shot region on the periphery of the substrate 10 is imprinted. Now, a difference may be generated between the height of the upper surface of the assist member 15 and the height of the upper surface of the substrate 10 held on the substrate chuck 14 within a limit not causing a difference of 1% or more in air density between the space above the assist member 15 and the space above the substrate 10. For example, this limit can be kept when the difference between the heights of the upper surface of the assist member 15 and the upper surface of the substrate 10 held on the substrate chuck 14 is 1 mm or smaller. More desirably, this limit can be kept when the difference between the heights of the upper surface of the assist member 15 and the upper surface of the substrate 10 held on the substrate chuck 14 is 0.1 mm or smaller.

Glass, ceramic, metal, an imprinting material, or another material is used for the substrate 10, and on the surface of a material, a member made from a material different from the substrate 10 may be formed as appropriate. Specific examples of the substrate 10 include a silicon wafer, a compound semiconductor wafer, and a glass wafer containing silica as a material thereof. Further, the substrate 10 may be a glass substrate for producing a replica mold from a master mold in the imprinting processing.

An application unit 5 (a supply unit) is set near the mold holding unit 3, and applies the photo-curable composition 9 onto at least one shot region (a molding region) on the substrate 10. The application unit 5 employs the inkjet method as the application method, and includes a container 19, which contains the photo-curable composition 9 in an uncured state, and the discharge unit 20.

Desirably, the container 19 is configured to allow the photo-curable composition 9 to be managed while keeping the inside thereof under an environment that not causes a curing reaction of the photo-curable composition 9, such as an atmosphere containing slight oxygen. Further, desirably, the container 19 is made from a material capable of preventing particles and a chemical impurity from entering the photo-curable composition 9.

The discharge unit 20 includes a piezoelectric discharge mechanism (inkjet head) including a plurality of discharge ports by way of example. The amount of application (amount of discharge) of the photo-curable composition 9 can be adjusted within a range of 0.1 to 10 pL per droplet, and, normally, the photo-curable composition 9 is often used at approximately 1 pL per droplet. The total amount of application of the photo-curable composition 9 is determined according to the density of the pattern portion 7*a* and a desired residual film thickness. The application unit 5 applies the photo-curable composition 9 while dispersing it as liquid droplets onto the shot region to control the application position, the application amount, and the like, based on operation instructions from the control unit 6, which will be described below.

An alignment measurement unit 21 measures alignment marks formed on the substrate 10. Further, the imprinting apparatus 1 includes a surface plate 22 as a reference plane, on which the substrate stage 4 is placed, a bridge surface plate 23, on which the mold holding unit 3 is fixed, and support rods 25, which extend from the surface plate 22 and support the bridge surface plate 23 via vibration isolators 24 that reduce the vibration from the floor surface.

Further, the imprinting apparatus 1 can include a mold conveyance unit that conveys in and out the mold 7 between the outside of the apparatus and the mold holding unit 3, and a substrate conveyance unit that conveys in and out the substrate 10 between the outside of the apparatus and the substrate stage 4, both of which are not illustrated.

The control unit 6 includes at least one computer provided with a central processing unit (CPU), a memory, and the like. The control unit 6 is connected to components of the imprinting apparatus 1 via a line, and controls the operation and the adjustment of the components of the imprinting apparatus 1 with programs stored in the memory. Further, the control unit 6 may be configured integrally with the other portions of the imprinting apparatus 1 (in a common housing) or may be configured separately from the other portions of the imprinting apparatus 1 (in a different housing).

Now, the imprinting method (the imprinting processing) performed by the imprinting apparatus 1 will be described. First, the control unit 6 causes the substrate conveyance unit to place and fix the substrate 10 onto the substrate stage 4 by. Next, the control unit 6 causes the alignment measurement unit 21 to sequentially measure the alignment marks on the substrate 10 to detect the position of the substrate 10 with highly accuracy, while driving the stage driving mechanism 16 to change the position of the substrate 10 as appropriate.

Then, the control unit 6 calculates each transfer coordinate based on the result of this detection, and causes the pattern to be molded sequentially per predetermined shot based on the result of this calculation (step and repeat). As a process of the pattern molding on one shot region, the control unit 6 first causes the stage driving mechanism 16 to position an application position on the substrate 10 (a specific position on the shot region) under the discharge port of the discharge unit 20. After that, the application unit 5 applies the photo-curable composition 9 onto the shot region on the substrate 10 (an application process).

Next, the control unit 6 causes the stage driving mechanism 16 to move and position the substrate 10 in such a manner that the shot region is located at a pressing position under the pattern portion 7*a*. Next, the control unit 6 carries out alignment between the pattern portion 7*a* and the substrate-side pattern on the shot region, causes a magnification correction mechanism to make a magnification correction of the pattern portion 7*a*, and performs other operations. After that, the control unit 6 drives the mold movement mechanism 12. When the pattern portion 7*a* is pressed against the photo-curable composition 9 on the shot region, the pattern portion 7*a* is deformed into a shape protruding toward the substrate 10 (an imprinting process). As a result of this pressing, the photo-curable composition 9 is loaded into the relief pattern of the pattern portion 7*a*.

The control unit 6 determines the completion of the imprinting process using a load sensor (not illustrated) mounted inside the mold holding unit 3. In this state, the irradiation unit 2 irradiates the photo-curable composition 9 on the back surface (the upper surface) of the mold 7 for a predetermined time as a curing process, with the light 8, thereby curing the photo-curable composition 9 with the light 8 transmitted through the mold 7. Then, after the photo-curable composition 9 is cured, the control unit 6 drives the mold movement mechanism 12 again to separate the pattern portion 7*a* from the substrate 10 (a mold release process). As a result, a three-dimensional photo-curable composition pattern (a layer) is molded according to the relief pattern of the pattern portion 7*a* on the surface of the shot region on the substrate 10. The imprinting apparatus 1 can mold a plurality of photo-curable composition patterns on one substrate 10 by performing such a series of imprinting operations a plurality of times while changing the shot region by driving the substrate stage 4.

Figure 6A:
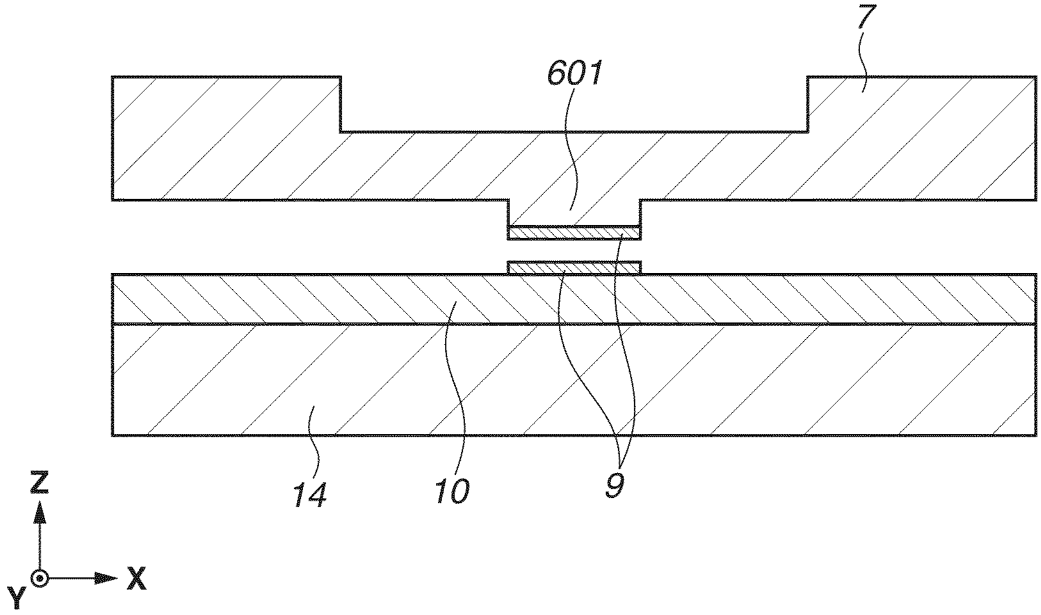
FIG. 6A illustrates a remaining photo-curable composition on a mesa portion of a mold after the mold is released.

Now, a defect in the mold release process will be described. Although it is desirable that the photo-curable composition 9 is not present on a mesa portion 601 of the mold 7 In the mold release process, the photo-curable composition 9 may remain on the mesa portion 601 of the mold 7 after the mold release as illustrated in FIG. 6A. If the photo-curable composition 9 remains on the mesa portion 601, this photo-curable composition 9 becomes foreign particles and causes a defect at the time of the pattern formation during the imprinting, when the imprint is pressed next time.

Figure 6B:
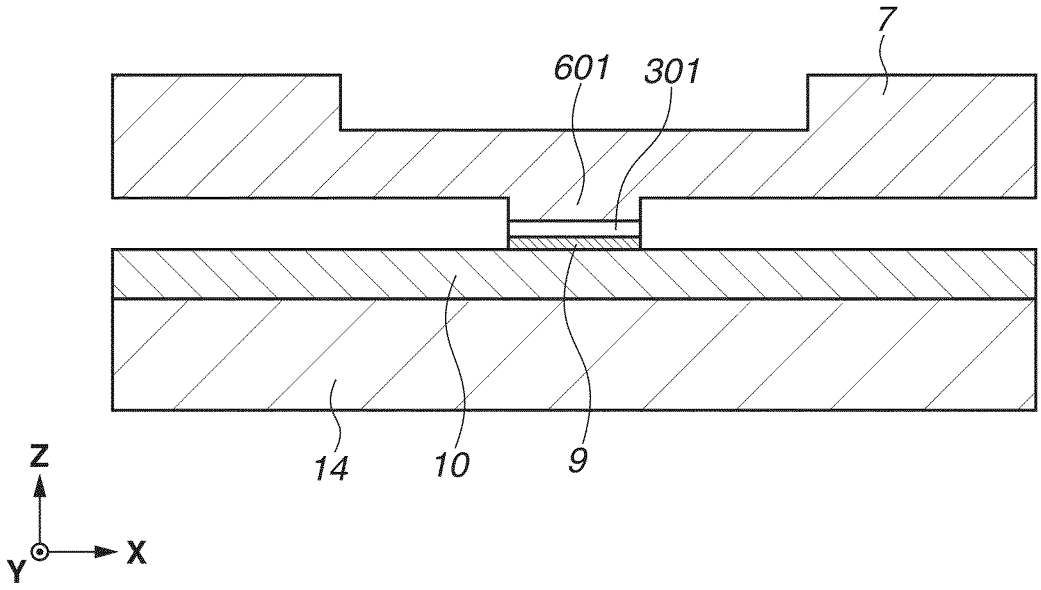
FIG. 6B illustrates a pattern formation using a curable composition containing a mold release agent.

In light thereof, a similar pattern formation, i.e., the curing of a curable composition is conducted using a curable composition containing a mold release agent (a surfactant agent or the like) 301 in the photo-curable composition 9 at the time of imprinting as illustrated in FIG. 6B. In this case, the mold release agent 301 in the composition will be segregated on an interface between the composition and the mold while the curable composition is being cured and supplied to the surface of the mold 7. The photo-curable composition 9 can be prevented from remaining on the mesa portion 601 of the mold 7 at the time of the mold release process by performing a process of applying the mold release agent onto the mold surface (a priming process) in advance before the imprinting.

However, it is known that the efficiency of supply of this mold release agent 301 varies depending on the condition of the surface of the mesa portion 601 of the mold 7. It has been revealed that, after the mold 7 is washed, the surface of the mesa portion 601 becomes hydrophilic, preventing the mold release agent 301 from being efficiently supplied thereto. This inconvenience can be dealt with by, for example, increasing the photo-curable composition or increasing the imprinting time to efficiently supply the mold release agent 301 to the mesa portion 601. However, performing the priming process once often fails to allow the mold release agent 301 to be sufficiently supplied, and, actually, the priming process should be performed a plurality of times.

This priming process therefore is not performed using a process substrate for production, and is performed using another substrate. A priming substrate used in this priming process is stored in the apparatus, and is used at a timing when the next priming process is performed.

This timing when the priming process is performed comes after the mold 7 is washed as described above, which means that this priming substrate is stored in the apparatus for a long period of time depending on the production process.

Figure 7:
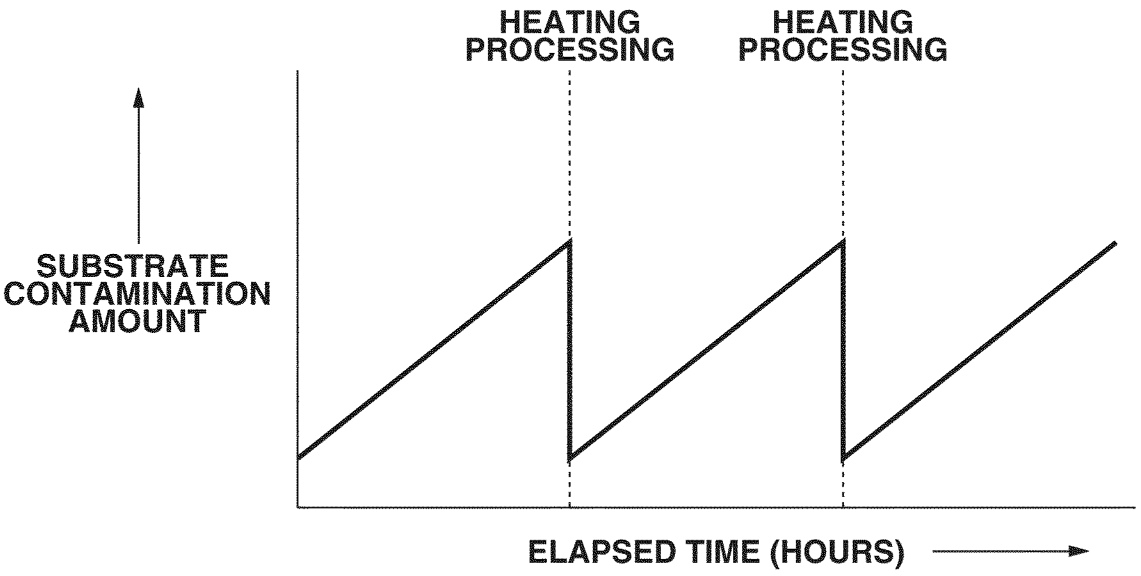
FIG. 7 illustrates a timing and an effect of processing.

The surface of the priming substrate is being contaminated as time passes, as illustrated in FIG. 7. The speed of this contamination of the priming substrate depends on the environment under which the priming substrate is stored. The same adhesion layer (not illustrated) as a process substrate has is formed on the priming substrate.

This adhesion layer is a foundation layer formed for the purpose of bonding the photo-curable composition to the substrate, and is formed on the surface of the priming substrate as a solid-phase film by applying an adhesion layer formation composition onto the surface of the substrate by the spin coating method or the like and then baking it after that. It has been revealed that, if chemical contamination is inadvertently attached to the surface of this adhesion layer, the fillability of the photo-curable composition containing the mold release agent is impaired at the time of the priming process.

To prevent this, a time is learned when the contaminated state of the priming substrate reaches an unallowable level in advance. Assume that the priming is carried out every 30 minutes (this time is not limited) with the priming substrate stored in the apparatus, and the timing when the number of defects suddenly increases in the priming is determined.

This timing is set as a recovery time of the priming substrate.

Figure 8A:
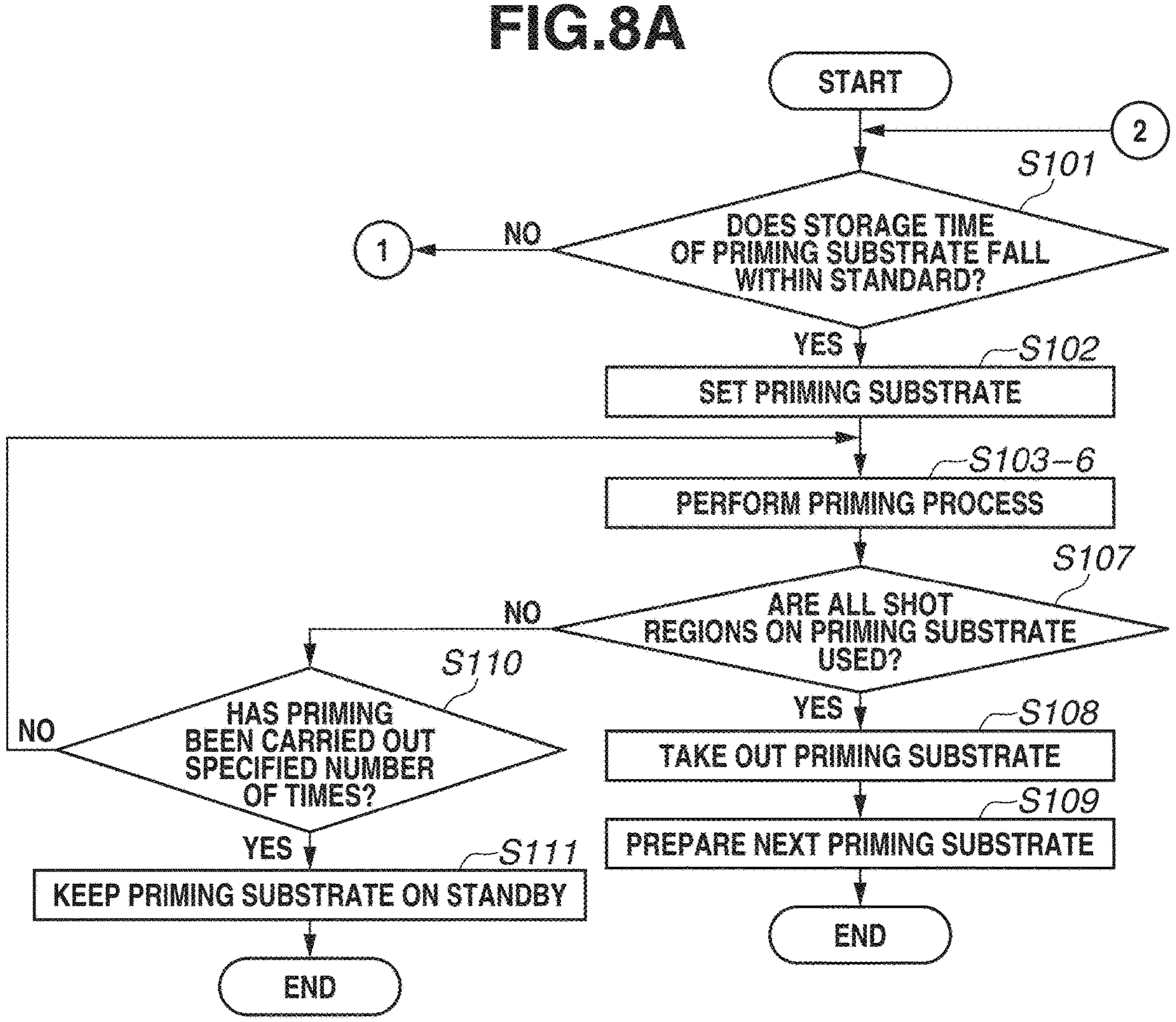
FIGS. 8A and 8B are flowcharts for carrying out priming.
Figure 8B:
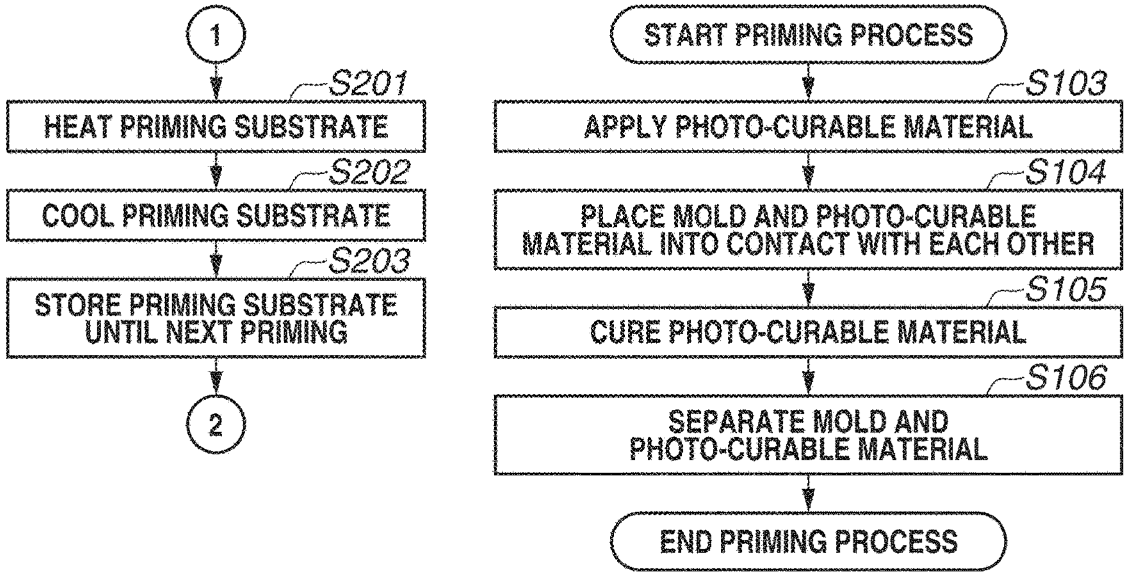

FIGS. 8A and 8B are flowcharts illustrating the imprinting processing accompanied by the priming process.

First, in step S101, the control unit 6 calculates the elapsed time since the priming substrate was used last time. If the storage time since the last use is within a time set to the control unit 6 (for example, three hours) (YES in step S101), in step S102, the control unit 6 controls the substrate conveyance mechanism (not illustrated) to set the priming substrate 26 on the substrate chuck 14. Next, the priming process S103 to S106 is performed. As shown in FIG. 8B, those priming steps S103 to S106 are as follows. The photo-curable material containing a mold release agent is applied on the priming substrate (S103). Thereafter, the photo-curable material applied on the priming substrate is brought into contact with the mold (S104). Thereafter, the photo-curable material is cured with the mold in contact (S105). Thereafter, the mold and the photo-curable material are separated (S106).

After that, in step S107, the control unit 6 determines whether all shot regions to be used on the priming substrate have been used. If the priming substrate is still usable (NO in step S107), the next priming process is performed. The priming is carried out as many times as preset to the control unit 6. Normally, the priming is carried out a plurality of times. As the priming process advances, the control unit 6 controls the substrate conveyance mechanism (not illustrated) to take the priming substrate 26 out from the substrate chuck 14. After that, the priming process is performed, and the control unit 6 determines whether an effective priming region is available on the priming substrate.

If no effective priming region is available on the priming substrate (YES in step S107), the control unit 6 performs control to prepare the priming substrate in such a manner that this priming substrate is taken out of the apparatus, and a new priming substrate is set in. If an effective region is available on the priming substrate in step S107 (NO in step S107), the control unit 6 determines whether the priming has been carried out the pre-specified number of times. If the priming has not been carried out the pre-specified number of times (NO in step S110), the priming process is performed again. If the priming process has been performed the pre-specified number of times (YES in step S110), the priming process is ended, and the priming substrate 26 is placed on standby for the next priming process at a predetermined position (not illustrated).

In step S101, the control unit 6 calculates the elapsed time (the storage time) since the priming substrate was used last time. If this elapsed time exceeds the set allowable time (for example, three hours) (NO in step S101), processing for recovering the priming substrate steps S201 to S203 is performed. As shown in FIG. 8B, the processing for recovering the priming substrate steps S201 to S203 are as follows. The surface of the priming substrate is heated by heating the priming substrate (S201). Thereafter, the heated priming substrate is cooled (S 202). Thereafter, the cooled priming substrate is stored in a storage part or the like until a next priming process is performed (S203). The processing for recovering the priming substrate is performed by heating the priming substrate in the present exemplary embodiment. The priming process is performed according to instructions from the control unit 6, and the timing thereof is not especially limited.

Now, the imprinting apparatus 1 according to the first exemplary embodiment of the present disclosure will be described with reference to FIG. 2.

In the present exemplary embodiment, a priming unit 27 for performing the priming process is provided in the apparatus. The priming unit 27 may be provided with a function as a storage unit for storing a priming substrate dedicated for priming in the apparatus, or may have a storage unit separate from the priming unit. A driving mechanism for bringing a priming substrate into contact with a mold for performing priming processing is provided.

Figure 2:
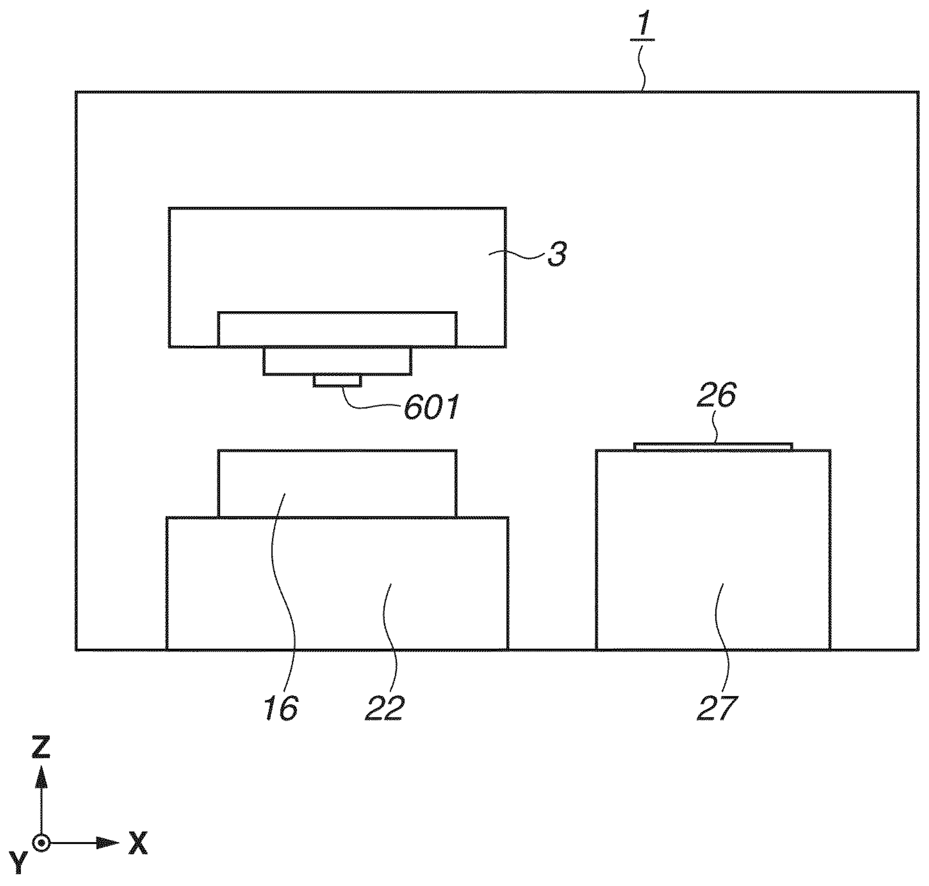
FIG. 2 illustrates an operation method according to the first exemplary embodiment.

In the present exemplary embodiment, the imprinting apparatus 1 includes therein a priming unit 27 having a temperature adjustment unit for performing the recovery processing by heating the priming substrate 26 as illustrated in FIG. 2. In this embodiment, the priming unit 27 also serves as a storage unit. Heating the priming substrate 26 can volatilize the contaminant on the surface, thereby recovering the surface state of the priming substrate 26. The same adhesion layer (not illustrated) as the process substrate has is on the surface of the priming substrate 26.

The heating process on the priming substrate 26 is desirable to keep the conditions equal to or lower and shorter than a baking temperature and a baking time used when this adhesion layer formation composition is applied, relatively. Heating the priming substrate 26 over this temperature and time may undesirably impair the adhesion capability of this adhesion layer. This temperature and time vary depending on the adhesion layer to be used, and it therefore is useful to register the type of the adhesion layer to be used with the control unit 6 in advance. The heating temperature and time can be adjusted depending on the adhesion layer to be used based on the registered information.

From the viewpoint of the production efficiency, it is desirable to set the temperature in the temperature adjustment unit of the priming unit 27 to the heating temperature in advance before starting the processing for heating the priming substrate, and also to adjust the temperature in the temperature adjustment unit of the priming unit27 to the room temperature (for example, 23° C.) promptly after the heating processing. Upon the completion of the temperature adjustment to the room temperature after the priming substrate is heated, the priming substrate 26 is placed on standby until the next priming.

At the timing when the priming processing is performed, the control unit 6 controls the above-described substrate conveyance mechanism (not illustrate) to set the priming substrate 26 onto the substrate chuck 14 (step S102), and the priming substrate 26 is set in the apparatus.

If the amount of foreign particles on the priming substrate 26 can be detected or estimated, it is effective to control the timing of performing the priming processing depending on this amount of foreign particles.

For example, the control unit 6 may be configured to determine that the foreign particles fall within an allowable range if the amount of foreign particles on the priming substrate is 0.004 (the number of foreign particles per substrate) or less, the size of the particle diameter is 80 nm or smaller, and the material of the foreign particles is inorganic particles, and control the imprinting apparatus 1 to perform the priming processing if the foreign particles exceed this allowable range.

The priming process according to the present exemplary embodiment is performed according to instructions from the control unit 6, and the timing thereof is not especially limited.

Figure 3:
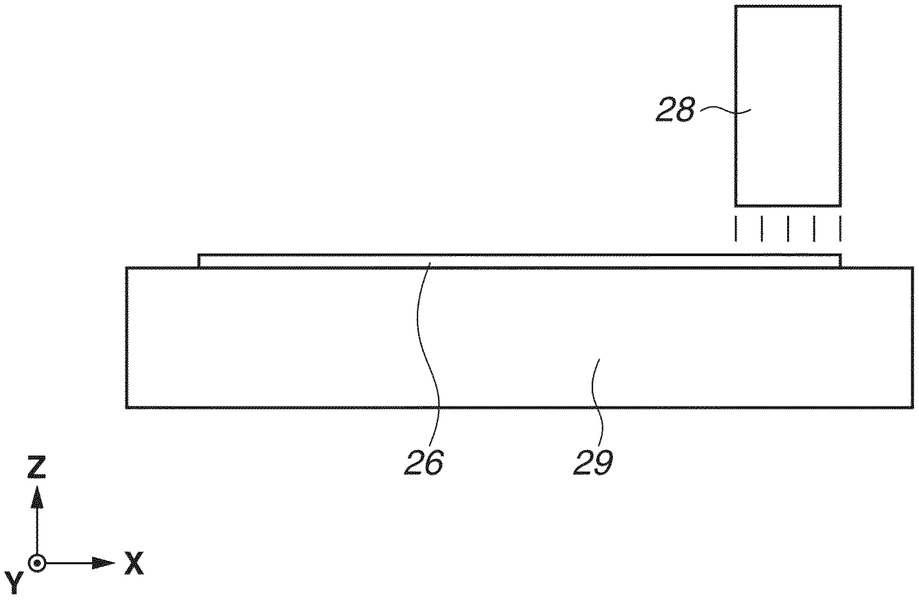
FIG. 3 illustrates an imprinting apparatus according to a second exemplary embodiment.

Next, an imprinting apparatus according to a second exemplary embodiment will be described with reference to FIG. 3. FIG. 3 is a schematic view of a heating device portion in the imprinting apparatus according to the second exemplary embodiment. The imprinting apparatus according to the present exemplary embodiment includes a heating device 28 in the imprinting apparatus, and the priming substrate is heated in a contactless manner from the heating device 28 disposed above the priming substrate. Heating the priming substrate can volatilize the contaminant on the surface of the adhesion layer, thereby recovering the surface state of the priming substrate.

Desirably, the conditions under which the priming substrate is heated follow the baking temperature and time used when the adhesion layer is formed. This temperature and time vary depending on the adhesion layer to be used, and it therefore is useful to register the type of the adhesion layer to be used with the control unit 6 in advance. The heating temperature and time can be adjusted depending on the adhesion layer to be used based on the registered information. The present second exemplary embodiment will be described regarding a configuration that partially recovers the priming substrate.

This exemplary embodiment is effective if a partial region remaining unused in the previous priming processing for some reason in the priming substrate is used in the later processing. The present exemplary embodiment is directed to heating a region in the priming substrate the priming processing to be performed on to perform the recovery processing thereon. Radiation heat using a heater, direct heating using electromagnetic waves, or another heating method is employed as the heating method.

The distance between the top surface of the priming substrate 26 stored in a temperature adjustment unit 29 also serving as a priming substrate storage unit and the bottom surface of the heating device 28 may be 1 mm or shorter. Further, it is desirable that the region to be heated is equivalent to the size of the shot with which the imprinting processing is performed, but the size of this processing region is not especially defined. The priming process is performed according to instructions from the control unit 6, and the timing thereof is not especially limited.

Figure 4:
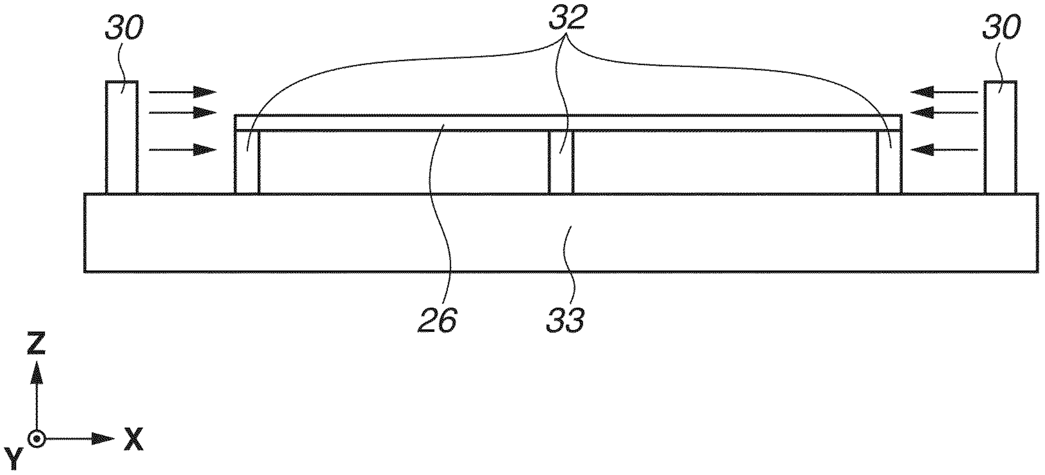
FIG. 4 illustrates an imprinting apparatus according to a third exemplary embodiment.

Next, an imprinting apparatus according to a third exemplary embodiment will be described with reference to FIG. 4. FIG. 4 is a schematic view of a heating device portion included in the imprinting apparatus according to the third exemplary embodiment. The imprinting apparatus according to the present exemplary embodiment includes heating devices 30 in the imprinting apparatus, and the priming substrate is heated in a contactless manner by heated gas supplied from the side surface of the priming substrate. Heating the priming substrate can volatilize the contaminant on the surface, thereby recovering the surface state of the priming substrate.

Desirably, the conditions under which the priming substrate is heated follow a baking temperature and time used when the adhesion layer is formed. This temperature and time vary depending on the adhesion layer to be used, and it therefore is useful to register the type of the adhesion layer to be used with the control unit 6 in advance. The heating temperature and time can be adjusted depending on the adhesion layer to be used based on the registered information.

The third exemplary embodiment is applied to a case where the entire priming substrate is heated. Holding pins 32, which hold the priming substrate, are provided on a substrate storage unit 33. Glass, ceramic, metal, or another material is used as the material of the holding pins 32, and the holding pins 32 may be made of a different member as appropriate. The gas is ejected from gas ejection units 30 at a temperature set by the control unit 6, and heats the priming substrate.

The gas ejection units 30 are desirably arranged symmetrically with respect to the priming substrate to efficiently heat the priming substrate. In the present exemplary embodiment illustrated in FIG. 4, the gas ejection units 30 are disposed at two positions outside the priming substrate, but are not limited to this layout and may be arranged at a plurality of positions, such as four positions and eight positions. Further, the gas to be used is desirably clean gas, and is desirably inert gas that will not chemically affect the adhesion layer on the priming substrate, such as clean dry gas and nitrogen gas. The priming process is performed according to instructions from the control unit 6, and the timing thereof is not especially limited.

Figure 5:
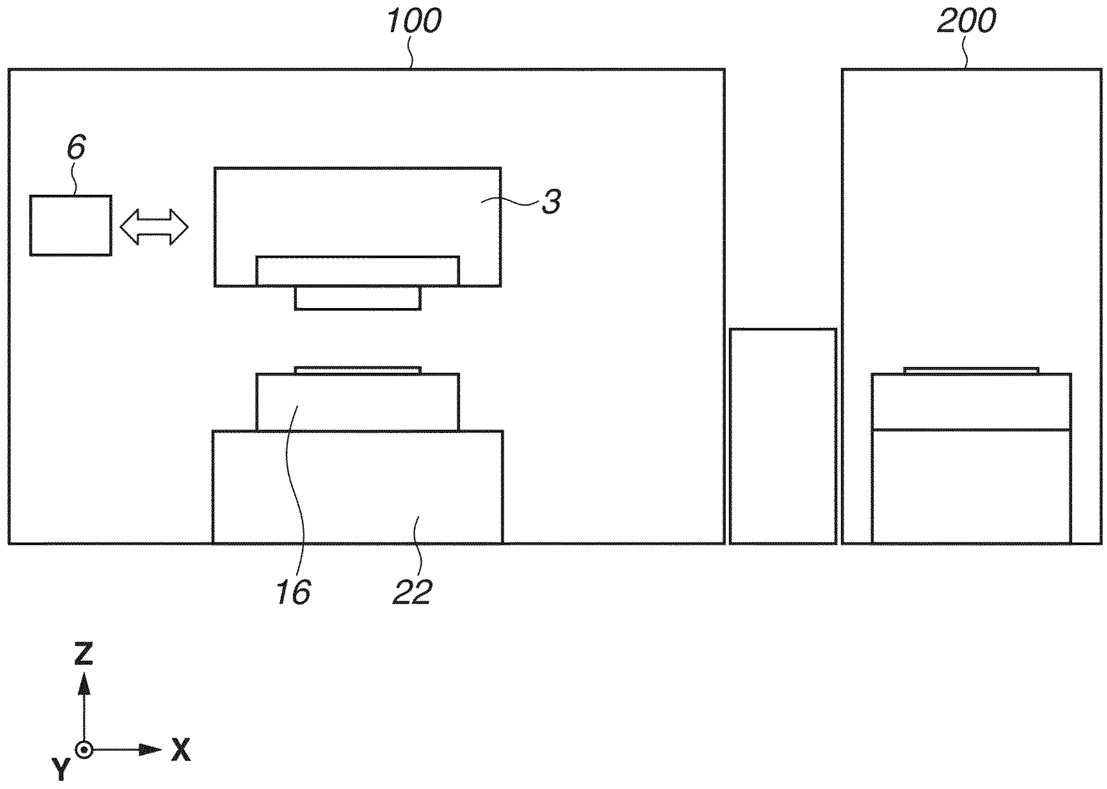
FIG. 5 illustrates an imprinting apparatus according to a fourth exemplary embodiment.

Next, an imprinting apparatus according to a fourth exemplary embodiment will be described with reference to FIG. 5. FIG. 5 is a schematic view of the imprinting apparatus and a peripheral device according to the fourth exemplary embodiment. The imprinting apparatus according to the present exemplary embodiment performs the processing of heating the priming substrate on the peripheral device outside the imprinting apparatus.

The temperature and time at and for which the priming substrate is heated vary depending on the adhesion layer to be used, and it therefore is useful to register the type of the adhesion layer to be used with the control unit 6 in advance. The heating temperature and time can be adjusted depending on the adhesion layer to be used based on the information registered with the control unit 6.

The priming substrate is transferred from the imprinting apparatus 100 to the peripheral device 200, such as a liquid coating applicator (a coater), and the recovery processing is performed by heating the priming substrate. A known coating applicator, such as a spin coater and a slit coater, can be used as the liquid coating applicator.

Information about a processing start time is transmitted from the control unit 6 of the imprinting apparatus 100 to the peripheral device 200, and the peripheral device 200 performs the recovery processing by heating the priming substrate based on this information. After that, the peripheral device 200 conveys the processed priming substrate to the imprinting apparatus 100. The priming process is performed according to instructions from the control unit 6, and the timing thereof is not especially limited.

(Method for Manufacturing Product)

The pattern of the cured object molded using the imprinting apparatus is permanently used for at least a part of various kinds of products, or is temporarily used when various kinds of products are manufactured. Examples of the products include an electric circuit element, an optical element, a micro electro mechanical system (MEMS), a recording element, a sensor, and a mold. Examples of the electric circuit element include a volatile or non-volatile semiconductor memory, such as a dynamic random access memory (DRAM), a static random access memory (SRAM), a flash memory, and a magnetoresistive random access memory (MRAM), and a semiconductor element, such as a large scale integration (LSI), a charge coupled device (CCD), an image sensor, and a field-programmable gate array (FPGA). Examples of the mold include a mold for imprinting.

The pattern of the cured object is directly used as at least a part of components of the above-described product, or is temporarily used as a resist pattern. The resist pattern is removed after etching, ion implantation, or the like is carried out during a substrate processing process.

Figure 9A:
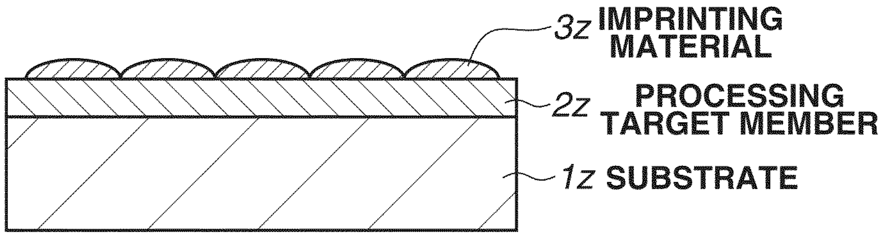
FIGS. 9A to 9F are schematic views illustrating a method for manufacturing a product.

Next, a specific method for manufacturing the product will be described. As illustrated in FIG. 9A, a substrate 1*z*, such as a silicon wafer, including a processing target member 2*z*, such as an insulator, molded on the surface thereof, is prepared. Subsequently, a photo-curable composition 3*z* is applied onto the surface of the processing target member 2*z* by the inkjet method. In the present example, FIG. 9A illustrates that the photo-curable composition 3*z* is applied on the substrate 1*z* in the form of a plurality of droplets.

Figure 9B:
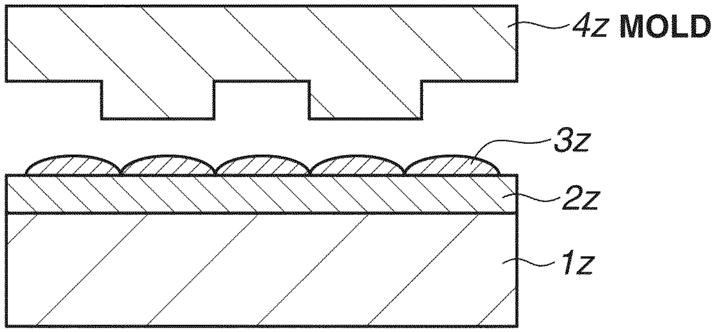
Figure 9C:
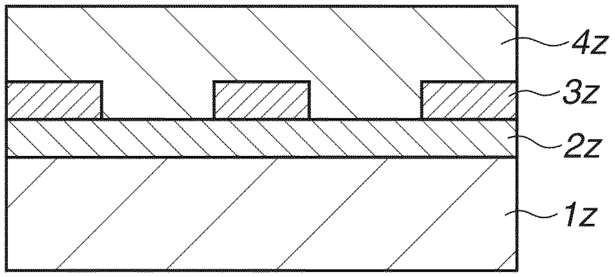

As illustrated in FIG. 9B, the side with a relief pattern of a mold 4*z* for imprinting is turned to face the photo-curable composition 3*z* on the substrate 1*z*. As illustrated in FIG. 9C, the substrate 1*z* with the photo-curable composition 3*z* applied thereon and the mold 4*z* are brought into contact each other, and a pressure is applied thereto.

This causes the photo-curable composition 3*z* to fill up the gap between the mold 4*z* and the processing target member 2*z*. When being irradiated with light as curing energy via the mold 4*z* in this state, the photo-curable composition 3*z* is cured.

Figure 9D:
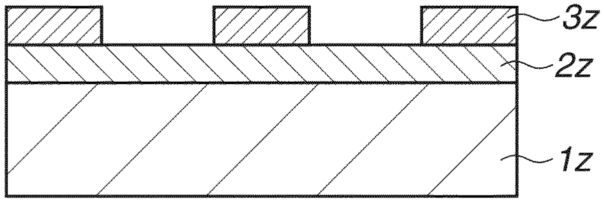

As illustrated in FIG. 9D, when the mold 4*z* and the substrate 1*z* are separated from each other after the photo-curable composition 3*z* is cured, the pattern of the cured object of the photo-curable composition 3*z* is molded on the substrate 1*z*. This pattern of the cured object is shaped in such a manner that the recessed portion of the mold 4*z* corresponds to the protruding portion of the cured object, and the protruding portion of the mold 4*z* corresponds to the recessed portion of the cured object, which means that the relief pattern of the mold 4*z* is transferred to the photo-curable composition 3*z*.

Figure 9E:
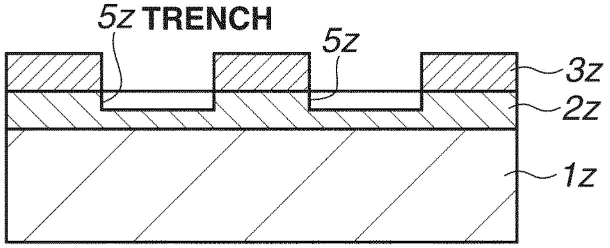
Figure 9F:
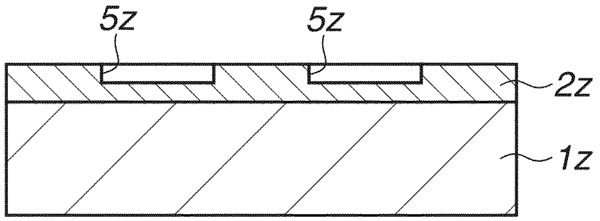

As illustrated in FIG. 9E, when etching is carried out using the pattern of the cured object as an etching-resistant mold, the portions of the surface of the processing target member 2*z* where the cured object is absent or thinly remains are removed and converted into trenches 5*z*. As illustrated in FIG. 9F, a product with the trenches 5*z* molded on the surface of the processing target member 2*z* can be acquired by removing the pattern of the cured object. The pattern of the cured object is removed in the present example, but may also be used as, for example, an interlayer insulation film included in a semiconductor device or the like, i.e., a component member of the product without being removed even after the processing.

Further, the exemplary embodiments of the present disclosure have been described based on the imprinting apparatus that forms the pattern of the cured object on the substrate using the mold having a relief on the surface thereof, but the present disclosure is not limited thereto. The present disclosure can also be applied to a planarization apparatus that forms a flat surface on a processing target substrate using a mold having a flat surface called a superstrate.

Having described the exemplary embodiments of the present disclosure, it is apparent that the present disclosure is not limited to these exemplary embodiments and can be modified and changed in various manners within the range of the spirit thereof.

According to the present disclosure, an imprinting apparatus and a method for manufacturing with an excellent mold release performance can be provided.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. A molding method for molding a cured object by bringing a mold into contact with a first curable composition on a processing target substrate and curing the first curable composition with the mold in contact therewith, the molding method comprising:

carrying out priming processing for applying a mold release agent onto a surface of the mold that contacts the first curable composition, the priming processing including applying the mold release agent onto the mold by placing a second curable composition containing the mold release agent on a priming substrate, bringing the second curable composition and the mold into contact with each other, curing the second curable composition in this contact state, and separating the mold and a cured second curable composition; and recovering a state of a surface of the priming substrate on which the second curable composition is placed, wherein the recovering includes heating the priming substrate, and wherein the priming substrate is heated using heated gas.

2. A method for manufacturing a product, the method comprising:

molding a first curable composition on a processing target substrate using a molding apparatus configured to mold a cured object by bringing a mold into contact with the first curable composition on the processing target substrate and curing the first curable composition with the mold in contact therewith, the molding apparatus including:

a priming unit configured to perform processing for applying a mold release agent onto a surface of the mold that contacts the first curable composition, the priming unit being configured to apply the mold release agent onto the mold by placing a second curable composition containing the mold release agent on a priming substrate, curing the second curable composition while the second curable composition and the mold are in contact with each other, and separating the mold and a cured second curable composition, and a recovery unit including a temperature adjustment unit to heat the priming substrate using heated gas and configured to perform a recovery processing to recover a state of a surface of the priming substrate on which the second curable composition is placed;

processing the processing target substrate including a molded first curable composition; and acquiring the product from the processed processing target substrate.

3. A method for manufacturing a product, the method comprising:

molding the first curable composition on the processing target substrate using the molding method according to claim 1;

processing the processing target substrate including the molded first curable composition; and acquiring the product from the processed processing target substrate.

* * * * *